(12) United States Patent
Seki et al.

(10) Patent No.: US 9,157,171 B2
(45) Date of Patent: Oct. 13, 2015

(54) PRODUCTION METHOD OF N-TYPE SIC SINGLE CRYSTAL, N-TYPE SIC SINGLE CRYSTAL OBTAINED THEREBY AND APPLICATION OF SAME

(75) Inventors: Akinori Seki, Shizuoka-ken (JP); Yasuyuki Fujiwara, Shizuoka-ken (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 589 days.

(21) Appl. No.: 13/201,771

(22) PCT Filed: Feb. 18, 2010

(86) PCT No.: PCT/IB2010/000314
§ 371 (c)(1),
(2), (4) Date: Aug. 16, 2011

(87) PCT Pub. No.: WO2010/095021
PCT Pub. Date: Aug. 26, 2010

(65) Prior Publication Data
US 2011/0297893 A1    Dec. 8, 2011

(30) Foreign Application Priority Data
Feb. 19, 2009   (JP) ................................. 2009-036905

(51) Int. Cl.
*C30B 15/04* (2006.01)
*C30B 29/36* (2006.01)
(Continued)

(52) U.S. Cl.
CPC ................. *C30B 29/36* (2013.01); *C30B 15/00* (2013.01); *C30B 15/02* (2013.01); *C30B 15/04* (2013.01);
(Continued)

(58) Field of Classification Search
CPC ........ C30B 29/36; C30B 15/00; C30B 15/02; C30B 15/04; H01L 29/1608; H01L 29/167
USPC ............. 117/78, 84, 105, 109, 19, 21; 257/77
See application file for complete search history.

(56) References Cited

U.S. PATENT DOCUMENTS 4,556,436 A    12/1985  Addamiano
7,972,704 B2 *  7/2011  Ohtani et al. ................. 428/446
(Continued)

FOREIGN PATENT DOCUMENTS

CN    101896647 A    11/2010
EP      1179620 A1    2/2007
(Continued)

OTHER PUBLICATIONS

Ikeda, M., et al. "Fabrication of 6H-SiC light-emitting diodes by rotation dipping technique: Electroluminescence mechanisms", J. Applied Physics 50(12), Dec. 1979, pp. 8215-8225.
(Continued)

*Primary Examiner* — Khanh Tuan Nguyen
*Assistant Examiner* — Haidung Nguyen
(74) *Attorney, Agent, or Firm* — Sughrue Mion, PLLC

(57) ABSTRACT

A method for producing n-type SiC single crystal, including: adding gallium and nitrogen, which is a donor element, for obtaining an n-type semiconductor during crystal growth of SiC single crystal, such that the amount of nitrogen as represented in atm unit is greater than the amount of gallium as represented in atm unit; an n-type SiC single crystal obtained according to this production method; and, a semiconductor device that includes the n-type SiC single crystal.

9 Claims, 4 Drawing Sheets

(51) Int. Cl.

| | |
|---|---|
| *C30B 15/02* | (2006.01) |
| *H01L 29/167* | (2006.01) |
| *C30B 15/00* | (2006.01) |
| *C30B 19/00* | (2006.01) |
| *H01L 21/02* | (2006.01) |
| *H01L 29/78* | (2006.01) |
| *H01L 29/872* | (2006.01) |
| *H01L 29/16* | (2006.01) |

(52) U.S. Cl.
CPC .......... *C30B 19/00* (2013.01); *H01L 21/02529* (2013.01); *H01L 21/02576* (2013.01); *H01L 21/02631* (2013.01); *H01L 21/02639* (2013.01); *H01L 29/167* (2013.01); *H01L 29/7802* (2013.01); *H01L 29/872* (2013.01); *H01L 29/1608* (2013.01)

(56) References Cited

U.S. PATENT DOCUMENTS

| | | |
|---|---|---|
| 2004/0266057 A1 | 12/2004 | Nagasawa |
| 2006/0174825 A1 | 8/2006 | Basceri et al. |
| 2008/0038531 A1* | 2/2008 | Sawamura et al. ........... 428/220 |
| 2008/0277670 A1* | 11/2008 | Kamiyama et al. ............. 257/77 |
| 2010/0289033 A1 | 11/2010 | Ohtani et al. |

FOREIGN PATENT DOCUMENTS

| | | | |
|---|---|---|---|
| JP | 06-219898 A | 8/1994 | |
| JP | 06-324214 A | 11/1994 | |
| JP | 2002-57109 A | 2/2002 | |
| JP | 2003-073194 A | 3/2003 | |
| JP | 2005-109408 A | 4/2005 | |
| JP | 2007-153719 A | 6/2007 | |
| JP | 2007-320790 A | 12/2007 | |
| WO | WO 2007058153 A1 * | 5/2007 | |
| WO | WO 2008155673 A2 * | 12/2008 | ............. C30B 29/36 |
| WO | WO2009091067 * | 7/2009 | |

OTHER PUBLICATIONS

Vodakov, Y.A., et al. "Electroluminescence of 6H-SiC doped with Ga and N", Sov. Tech. Phys. Lett. vol. 16, No. 7, Jul. 1990; pp. 531-533.

Ivanov, A.I., et al. "High-temperature luminescence in 6H-SiC doped with Ga and N", Sov. Tech. Phys. Lett., vol. 15, No. 9, Sep. 1989, pp. 677-678.

Japanese Office Action dated Apr. 19, 2011, issued in Japanese Patent Application No. 2009-036905.

Vodakov, et al., "Violet Light Diodes Based on 6H/4H-SIC[GA, N] Heteroepitaxial Layers Grown by the Sublimation Sandwich-Method", Pisma V Zhurnal Tekhnicheskoi Fiziki vol. 16, No. 14, pp. 19-22 Jul. 26, 1990.

Office Action, dated Mar. 17, 2014, issued by the State Intellectual Property Office of the People's Republic of China, in counterpart Application No. 201080008632.2.

* cited by examiner

PRODUCTION METHOD OF N-TYPE SIC SINGLE CRYSTAL, N-TYPE SIC SINGLE CRYSTAL OBTAINED THEREBY AND APPLICATION OF SAME

BACKGROUND OF THE INVENTION

1. Field of the Invention

The invention relates to a production method of an n-type SiC single crystal, an n-type SiC single crystal obtained by that method, and application thereof. More particularly, the invention relates to a production method of an n-type SiC single crystal in which gallium (Ga) and nitrogen (N), which is to be a donor element for obtaining an n-type semiconductor, are added during crystal growth, an n-type SiC single crystal obtained by that method, and application thereof.

2. Description of the Related Art

SiC single crystal is extremely thermally and chemically stable, has superior mechanical strength and is resistant to radiation. In addition, SiC single crystal has superior properties as compared with silicon (Si) single crystal, including high dielectric breakdown voltage and high thermal conductivity. Moreover, SiC single crystal is able to easily control the type of electron conduction to either p-type or n-type conduction depending on the impurity added, and also has the characteristic of a wide band gap (about 3.3 eV for 4H—SiC single crystal and about 3.0 eV for 6H—SiC single crystal). Consequently, SiC single crystal is able to realize high temperatures, high frequencies, withstand voltage and environmental resistance unable to be realized with conventional semiconductor materials such as Si single crystal or gallium arsenide (GaAs) single crystal, thus making it the target of growing expectations for use as a next-generation semiconductor material.

Methods have been proposed for obtaining p-type and n-type conduction SiC, single crystal for semiconductor materials that includes introducing an impurity during crystal growth, and studies are being conducted on SiC single crystal and production methods thereof that contain various impurities. Lowering resistance when current is applied that causes power loss is an important factor in semiconductor devices such as switching devices, which are considered to be one of the main applications of SiC single crystal.

Japanese Patent Application Publication No. 6-219898 (JP-A-6-219898) describes a method for producing n-type 6H—SiC single crystal by a sublimation method in which 20 to 100 ppm of Al are added to SiC powder followed by sublimation in a nitrogen gas atmosphere. This publication also describes a specific example of an n-type 6H—SiC single crystal obtained according to the method described above that has resistivity of 0.1 Ωcm. In addition, Japanese Patent Application Publication No. 2002-57109 (JP-A-2002-57109) describes a method for producing SiC for use as a p-type semiconductor or n-type semiconductor that has a step for forming an Si layer on a substrate, a step for adding to the Si layer an impurity which is at least one of element selected from the group consisting of N, B, Al, Ga, In, P, As, Sb, Se, Zn, O, Au, V, Er, Ge and Fe, and a step for forming an SiC layer to which an impurity has been added by carbonizing the Si layer to which the impurity has been added. In addition, JP-A-2002-57109 also describes SiC in which the impurity concentration is within the range of $1 \times 10^{13}/cm^3$ to $1 \times 10^{21}/cm^3$, and that resistivity may be increased by simultaneously adding a donor and an acceptor.

In addition, Japanese Patent Application Publication No. 2003-73194 (JP-A-2003-73194) describes a Method for producing SiC single crystal preferable for use as a p-type semiconductor. The production method includes sublimating an SIC powder, in which the nitrogen (N) content is 0.1 ppm or less and the total content of an element belonging to group 13 of the periodic table, such as B, Al, Ga, In or Tl, is equal to or greater than the nitrogen content, followed by growing SiC single crystal by recrystallization. In addition, JP-A-2003-73194 describes SiC single crystal in which volume resistivity is $1 \times 10^1$ Ωcm or less. This publication also describes a specific example of a p-type SiC single crystal obtained according to this method in which the content of Al, which is an element of group 13 of the periodic table, is 40 ppm and the N content is 0.05 ppm or less.

In addition, Japanese Patent Application Publication No. 2005-109408 (JP-A-2005-109408) describes an SiC epitaxial growth method and an SiC epitaxially grown film for fabricating a device having low on resistance and high withstand voltage, by controlling so that the SiC epitaxially grown film is doped with at least one of N, B, Al and P within a range of $5 \times 10^{23}$ cm$^{-3}$ to $3 \times 10^{19}$ cm$^{-3}$. Moreover, Japanese Patent Application Publication No 2007-320790 (JP-A-2007-320790) describes a method for producing SiC single crystal by doping SIC single crystal with a donor and an acceptor, an SiC single crystal ingot fabricated according to this production method, and a substrate that uses the SIC single crystal ingot. The production method includes introducing a gas source, which includes an impurity containing an element such as N serving as the donor and an impurity containing one or both of elements such as B or Al serving as the acceptor, into a crystal growth atmosphere. This publication also describes a specific example of SiC single crystal obtained according to the above method that has a nitrogen (N) concentration of $7 \times 10^{17}$ cm$^{-3}$ or $9 \times 10^{17}$ cm$^{-3}$.

However, it is necessary to add a large amount of nitrogen (N) in order to obtain n-type SiC single crystal that has low specific resistance by these conventional SiC single crystal production methods. As a result, the concentration of nitrogen (N) in the n-type SiC single crystal becomes excessively high and ends up impairing the inherent characteristics of SiC single crystal. In SIC single crystal that contains nitrogen (N), which is a donor element, because a portion of the Si or C that composes the SIC single crystal undergoes a change in atomic radius as a result of being replaced by nitrogen (N), dislocation (crystal defects, crystal distortion) occurs in the portion of the SiC single crystal that has been replaced by the above elements. The dislocation has an effect on the inherent properties of the SiC single crystal (for example, by causing an increase in leakage current), thereby impairing the inherent characteristics of the SiC single crystal. Consequently, n-type SiC single crystal is produced by establishing an upper limit on the doped amount of nitrogen (N), and n-type SiC single crystal provided for industrial use has specific resistance of 0.015 Ωcm to 0.028 Ωcm.

SUMMARY OF THE INVENTION

The invention provides a method for producing n-type SiC single crystal that has a specific resistance lower than that of the n-type SiC single crystal described above by reducing the amount of nitrogen (N), SiC single crystal that has a low specific resistance obtained according to this method, and application thereof.

The inventors completed the invention as a result of conducting extensive studies. A first aspect of the invention is a method for producing n-type SiC single crystal, including: adding gallium and nitrogen, which is a donor element for obtaining an n-type semiconductor, during crystal growth of SiC single crystal, such that the amount of nitrogen represented in atm unit is greater than the amount of gallium represented in atm unit. In addition, a second aspect of the invention is a method for producing n-type SiC single crystal, including: adding gallium and nitrogen, which is a donor element for obtaining an n-type semiconductor during, crystal growth of SiC single crystal by a solution method. In addition, a third aspect of the invention is n-type SiC single crystal obtained according to the above method. Moreover, a fourth aspect of the invention is a semiconductor device including the above n-type SiC single crystal.

The amount of the element nitrogen (N) in the invention refers to, depending on the case, the amount added or the total of the amount originally contained as impurity in graphite within the reaction apparatus and the amount added. The amount of the element gallium (Ga) in the invention refers to the amount added. In addition, inherent characteristics of SiC single crystal in the invention are evaluated based on carrier concentration (n) as determined according to the following equation:

$$n=1/(q\mu\rho)$$

(wherein, n represents the carrier concentration, q represents elementary charge, $\mu$ represents mobility, and $\rho$ represents specific resistance). Specific resistance is obtained by the Hall measurement using the Van der Pauw method described in detail in the examples to be described later. Characteristics of n-type SiC single crystal are considered to be good if carrier concentration has the order of magnitude of $10^{19}$ cm$^{-3}$ relative to an atomic density of impurity-free SiC single crystal of $10^{23}$ cm$^{-3}$.

According to the invention, n-type SiC single crystal can be obtained that has low specific resistance despite having a low amount of nitrogen (N). In addition, according to the invention, n-type SiC single crystal that has low specific resistance can be obtained without impairing the inherent characteristics of SiC single crystal. Moreover, according to the invention, a semiconductor device can be obtained that uses an n-type SiC single crystal that has low specific resistance without impairing the inherent characteristics of SiC single crystal.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

In the first aspect of the invention, gallium (Ga) and nitrogen (N), which is a donor element for obtaining an n-type semiconductor, are added during crystal growth of SiC single crystal such that the amount of nitrogen $A_N$ and the amount of gallium $A_{Ga}$, both represented in atm unit, satisfy the relationship of $A_N > A_{Ga}$. Namely, crystal growth is carried out by adding nitrogen and gallium such that the ratio of $A_{Ga}$ to $A_N$ ($A_{Ga}/A_N$) satisfies the relationship of $0 < A_{Ga}/A_N < 1$, and for example, $1/10000 < A_{Ga}/A_N < 1$, and particularly such that the respective added ratios of $N_{AD}$ and $Ga_{AD}$, both represented in atm % unit, of nitrogen and gallium to SiC satisfy the relationships of $0 < N_{AD} \leq 1.0$ atm % and $0 < Ga_{AD} \leq 0.06$ atm %. According to this production method, n-type SiC single crystal can be obtained that has low specific resistance of, for example, 0.01 $\Omega$cm or less, and particularly 0.008 $\Omega$cm or less.

In addition, in the second aspect of the invention, gallium (Ga) and nitrogen (N), which is a donor element of for obtaining an n-type semiconductor, are added during crystal growth of SiC single crystal by a solution method. In this production method, crystal is grown for obtaining n-type SiC single crystal so that the amount of nitrogen (N), which is a donor element used for obtaining an n-type semiconductor that is introduced to SiC single crystal, is lowered as much as possible. According to this production method, n-type SiC single crystal can be obtained that has low specific resistance of, for example, 0.01 $\Omega$cm or less, and particularly 0.008 $\Omega$cm or less.

The ratio of the amounts of nitrogen (N) and gallium (Ga) to SiC indicates the ratio of the amounts of nitrogen and gallium, represented in atm % unit, to the amount of SiC powder, that is, the raw material for SiC single crystal growth in the case the single crystal growth method is a sublimation method, for example. In addition, the ratio of the amounts of nitrogen (N) and gallium (Ga) to SiC is determined as the ratio of the amounts of nitrogen and gallium, represented in atm % unit, to the amount of SiC obtained by growing SiC from the all of Si in an Si-containing melt in the case the single crystal growth method is a solution method, for example.

Figure 1:
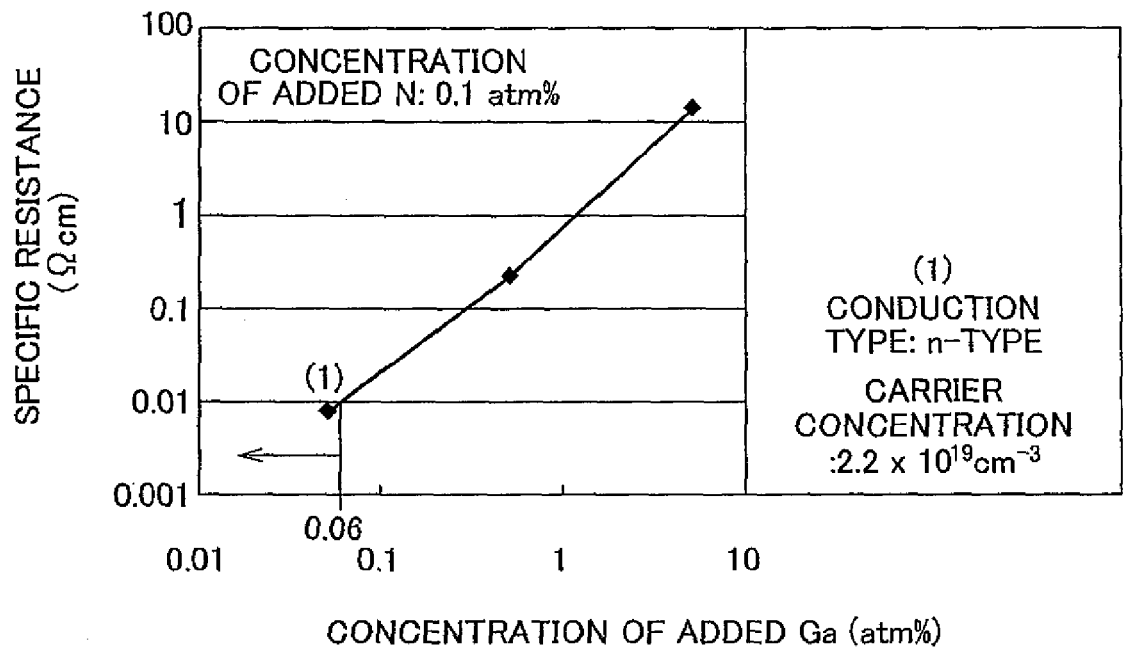
FIG. 1 is a graph illustrating the relationship between the amount of Ga added and the specific resistance of n-type SiC single crystal when the added amount of nitrogen (N), which is a donor element, is kept constant.

The following provides an explanation of embodiments of the invention with reference to the drawings. FIG. 1 shows changes in specific resistance of SiC single crystal obtained by crystal growth with changing the amount of Gallium (Ga) added while holding the amount of nitrogen, which is a donor element, for obtaining an n-type semiconductor constant (at 0.1 atm % to SiC). With reference to FIG. 1, when the amount of Ga is 0.06 atm % or less, the specific resistance of the SiC single crystal is 0.01 $\Omega$cm or less, and carrier concentration (n) is on the order of magnitude of $10^{19}$ cm$^{-3}$ and the conduction type is n type. This result indicates that when SiC crystal growth is carried out such that the amount of element of nitrogen $A_N$, which is a donor element, and the amount of the element of gallium $A_{Ga}$ represented in atm unit satisfy the relationship of $A_N > A_{Ga}$, the amount of nitrogen (N) relative to SiC is 1.0 atm % or less, and the amount of Gallium (Ga) relative to SiC is 0.06 atm % or less, n-type SiC single crystal can be obtained in which the specific resistance is 0.01 $\Omega$cm or less.

In the embodiments, n-type SiC single crystal is produced using an arbitrary SiC single crystal growth method such as a solution method, vapor phase method or sublimation method by adding nitrogen (N), which is a donor element, and gallium (Ga) during crystal growth of SiC single crystal in a ratio that satisfies the above-mentioned relationship of $A_N > A_{Ga}$. SiC bulk single crystal that has the same crystal structure as the crystal to be grown is preferably used as seed crystal in the SiC single crystal growth method described above. Examples of such SiC bulk single crystals include 3C—SiC, 4H—SiC, 6H—SiC and 15R—SiC. 6H—SiC and 4H—SiC are used particularly preferably, and in the case of using a solution method, 4H—SiC single crystal is used preferably.

Figure 2:
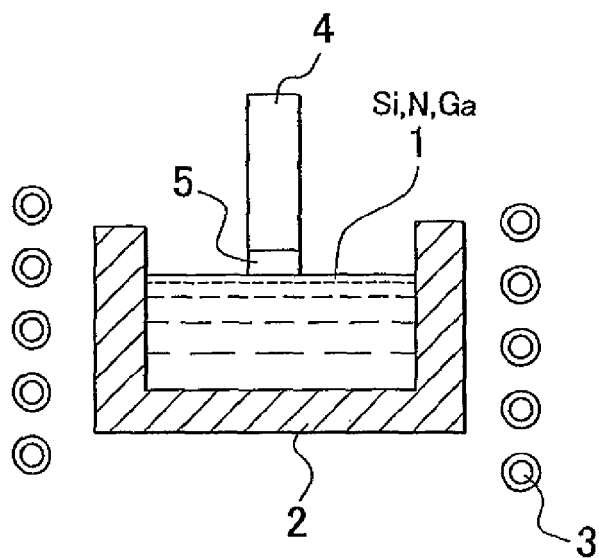
FIG. 2 is a schematic diagram of an apparatus that is applied to one embodiment of the invention of a production method that uses a solution method.
Figure 3:
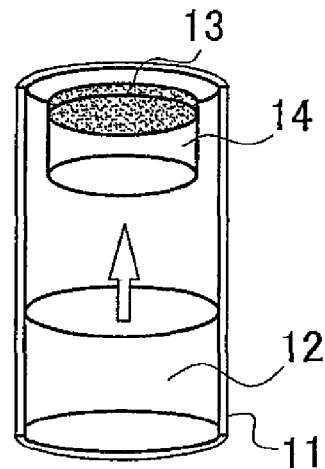
FIG. 3 is a schematic diagram of an apparatus that is applied to one embodiment of the invention of a production method that uses a sublimation method.

In the above-mentioned solution method, SiC single crystal may be grown using an SiC single crystal growth apparatus for a solution method as shown in FIG. 2, for example. The SiC single crystal growth apparatus for a solution method shown in FIG. 2 is provided with a crucible 2 that houses an Si containing melt 1 provided interposed with an insulating material (not shown) within a growth furnace (not shown), high-frequency coils 3 for maintaining a constant temperature by heating the melt 1 provided around the growth furnace, and a support part 4 capable of being raised and lowered, and a seed crystal 5 is installed on the end of the support part 4.

An arbitrary melt that contains Si along with N and Ga in the above-mentioned ratios may be used for the Si-containing melt. In addition, other examples of Si-containing melts include those containing Ti and/or Cr, such as an Si—Cr melt, Si—Ti melt, Si—Ti—Cr melt or Si—Cr—Ni melt. The N element may be contained in the melt by introducing all or a portion of the required amount in the form of nitrogen gas. In the case the N element is contained in the crucible of the SiC single crystal growth apparatus and/or in the support part (such as a carbon rod), the amount of nitrogen introduced in the form of nitrogen gas may be determined in consideration of the amount contained in the apparatus. The temperature of the Si-containing melt is about 1800° C. to 2100° C. and particularly about 1850° C. to 2100° C.

Control of the temperature of the Si-containing melt is carried out using a temperature control apparatus that heats by high-frequency induction heating based on a measured temperature determined by measuring temperature. Measurement of the temperature of the Si-containing melt is carried out by, for example, observing the temperature of the melt surface with a radiation thermometer and/or using a thermocouple (such as a tungsten/rhenium (W—Re) thermocouple) that is installed inside the support part (such as a carbon rod).

In the method for producing SiC single crystal that uses an SiC single crystal production apparatus for a solution method, conventional conditions for solution methods, such as the shape of the graphite crucible, heating method, heating time, atmosphere, temperature increase rate and cooling rate, may be applied. For example, although varying depending on the size of the crucible, the heating time (time from loading of raw material to the time when the SiC saturation concentration is reached) when using high-frequency induction heating is about 30 minutes to 200 hours (and for example, about 3 to 10 hours). The atmosphere consists of a rare gas such as He, Ne, Ar or other inert gas, and a portion thereof may be replaced with $N_2$. In addition, a portion of the inert gas may also be replaced with methane gas. The crystal growth as described above is preferably carried out in a melt heated to a growth temperature of 1880° C. to 2100° C.

An example of a method used for the above-mentioned sublimation method uses an apparatus in which a sublimation raw material 12 consists of SiC powder and Ga at 0.06 atm % or less based on the SiC powder are filled into the graphite crucible IL the seed crystal 13 which is an SiC single crystal substrate is attached to the inside of the cover of the graphite crucible, and the graphite crucible is installed within a double-walled quartz tube. In this example of the method, Ar gas and $N_2$ gas are then fed into the double-walled quartz tube so that the respective amounts of N and Ga as represented in atm unit satisfy the relationship $A_N > A_{Ga}$, and the temperature is controlled so that the temperature of the sublimation raw material of the SiC powder and Ga is 2300° C. or higher, for example, 2300° C., and the temperature of SiC single crystal substrate is 2200° C. or higher, and for example, 2200° C. Subsequently, pressure inside the double-walled quartz tube is reduced and SiC single crystal 14 is grow on the seed crystal 13.

According to the method of this embodiment, n-type SiC single crystal that has low specific resistance, and preferably n-type SiC single crystal that has specific resistance of 0.01 Ωcm or less, carrier concentration (n) on the order of magnitude of $10^{19}$ $cm^3$, and a conduction type of the n type, can be easily obtained despite a low amount of nitrogen (N). SiC single crystal obtained according to the method of this embodiment is 3C—SiC, 4H—SiC, 6H—SiC or 15R—SiC. The method of this embodiment is suitable for 6H—SiC and 4H—SiC in particular. Among these, 4H—SiC single crystal can be stably obtained in the case of applying a growth temperature of 1880° C. or higher in a solution method.

The n-type SiC single crystal obtained according to the method of this embodiment has low specific resistance, and preferably specific resistance of 0.01 Ωcm or less, over a wide temperature range such as a range of −55° C. to 250° C. Thus, this n-type SiC single crystal can be preferably used as a semiconductor material, and may be used in applications such as the switching device shown in FIG. 4 or the diode shown in FIG. 5. The switching device or diode described above has high reliability due to the low specific resistance and favorable crystal characteristics of the n-type SiC single crystal of this embodiment.

The following shows examples of the invention. In each of the following examples, SiC single crystal was grown using an SiC single crystal production apparatus for a solution method as shown in FIG. 2. In addition, the approximate temperature at which the seed crystal contacts the melt was measured with a radiation thermometer at high temperatures (1880° C. to 2100° C.) of the Si-containing melt. The radiation thermometer was installed on an observation window located above the level of the Si-containing melt that enabled direct observation of the melt surface. In addition, a thermocouple was installed on the inside (at a location 2 mm from the seed crystal) of the support part (carbon rod) to which the seed crystal was adhered, and temperature was measured immediately after contact with the melt.

Confirmation that the resulting SiC single crystal was of the n type and evaluation of the SiC single crystal were carried out in the manner described below.

Figure 6:
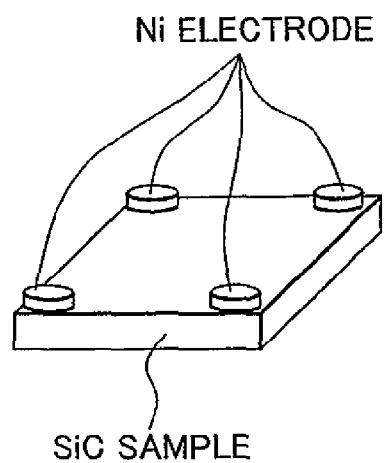
FIG. 6 is schematic diagram of a sample for the Hall measurement using the Van der Pauw method that is used to measure physical properties of n-type SiC single crystal obtained according to embodiments of the invention; and, FIGS. 7A and 7B are graphs illustrating temperature characteristics of specific resistance of n-type SiC single crystal obtained in examples and comparative examples.

(1) Evaluation of SiC Single Crystal Characteristics and Confirmation of Conduction Type SiC single crystal was cut out to a thickness of 900 μm in the shape of a square that measured 5 mm on a side, and ohmic electrodes were formed from Ni on the four corners as shown in FIG. 6 to prepare an SiC sample. Using this SiC sample, specific resistance was determined by the Hall measurement according to the Van der Pauw method at room temperature (26° C.), and carrier concentration was determined based on the specific resistance according to the equation shown below.

In addition, conduction type was confirmed based on the polarity of the Hall voltage during the Hall measurement:

$$n=1/(q\mu\rho)$$

(wherein, n represents carrier concentration, q represents elementary charge, μ represents mobility, and ρ represents specific resistance).

(2) Temperature Characteristics of Specific Resistance of SiC Single Crystal

Specific resistance at various temperatures was determined by varying the temperature of the SiC sample from 80 K to 580 K (about −190° C. to about 280° C.) and carrying out the Hall measurement in the same manner as (I) above at respective temperatures.

EXAMPLE 1

Figure 7A:
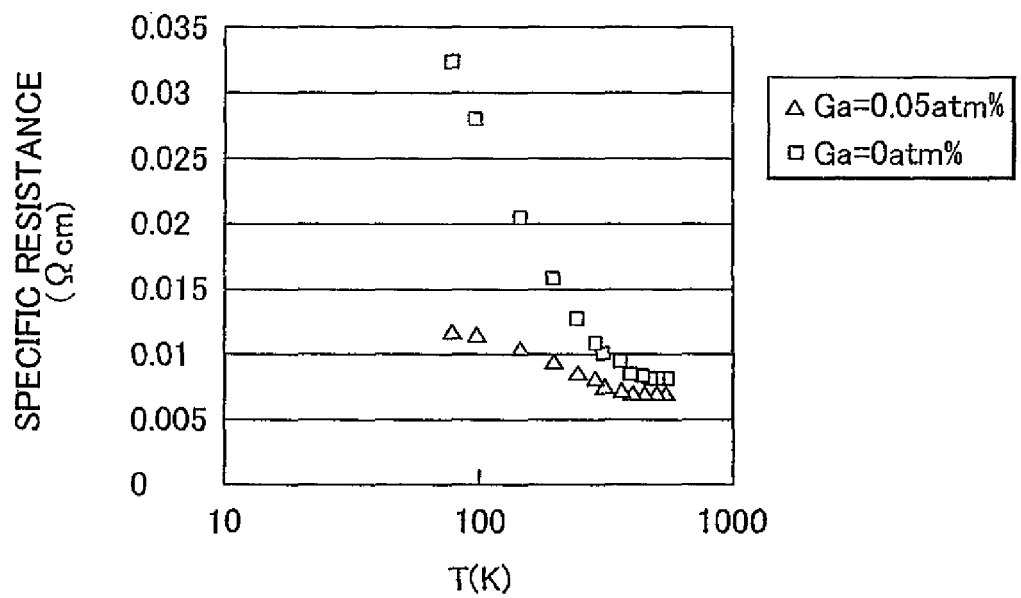
Figure 7B:
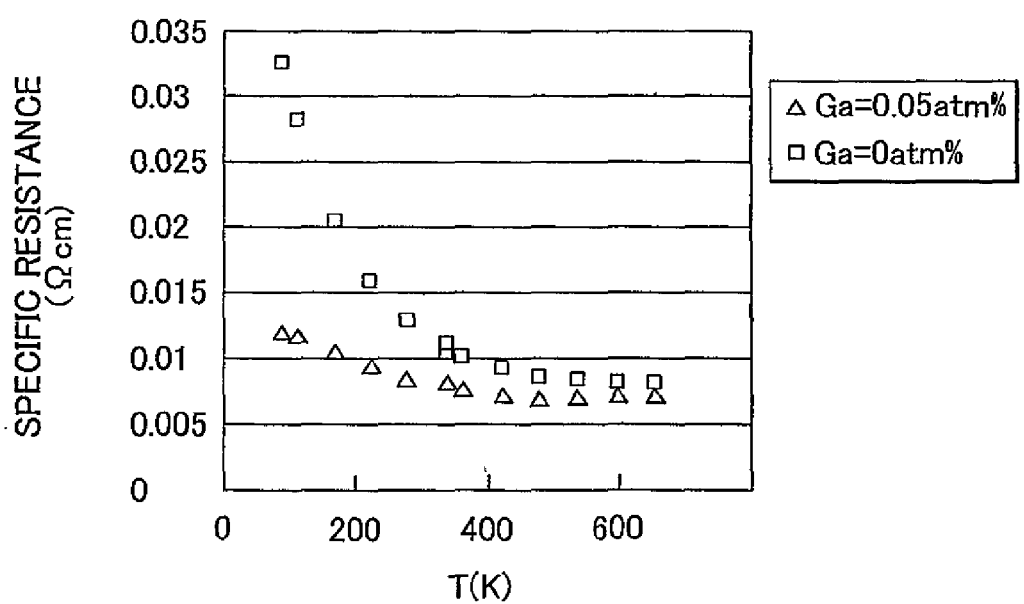

Crystal growth was carried out using the apparatus shown in FIG. 2. The raw material consists of 60 atm % of Si, 40 atm % of Cr, 0.1 atm % of N (the entire amount was supplied in the form of nitrogen gas) and 0.05 atm % of Ga to the SiC respectively were put in a graphite crucible. A seed crystal of 4H—SiC single crystal was immersed in a melt heated to a growth temperature of 2010° C. for about 8 hours to induce crystal growth. The resulting SiC single crystal was evaluated by the Hall measurement. The results are summarized in FIG. 1 and Table 1. In addition, temperature characteristics of specific resistance were evaluated. Those results are summarized in FIGS. 7A and 7B. FIG. 7A shows specific resistance temperature characteristics over a wide temperature range, while FIG. 7B shows specific resistance temperature characteristics over a narrow temperature range.

COMPARATIVE EXAMPLE 1

SiC single crystal was obtained by carrying out crystal growth in the same manner as Example 1 with the exception of not adding Ga. The resulting SiC single crystal was evaluated by the Hall measurement. The results are summarized in Table 1. In addition, temperature characteristics of specific resistance were evaluated. Those results are summarized in FIGS. 7A and 7B.

TABLE 1

| Amount of Ga added (atm %) | 0.05 | 0 |
|---|---|---|
| Conduction type | n | n |
| Specific resistance (Ωcm) | 0.008 | 0.011 |
| Carrier concentration (cm$^{-3}$) | 2.2 × 10$^{19}$ | 2.2 × 10$^{19}$ |

As is shown in FIG. 1 and Table 1, in Example 1, in which crystal was grown from an Si-containing melt to which N at 0.1 atm % and Ga at 0.05 atm % to SiC respectively was added, SiC single crystal having n-type conduction was obtained in which specific resistance was less than 0.01 Ωcm and carrier concentration was equal to that of SiC single crystal obtained without adding Ga. In contrast, in Comparative Example 1, in which crystal was grown without adding Ga, specific resistance exceeded 0.01 Ωcm. In addition, as shown in FIGS. 7A and 7B, n-type SiC single crystal grown from an Si-containing melt to which N and Ga were added demonstrated specific resistance of less than 0.015 Ωcm at 80 K to 580 K (about −190° C. to about 280° C.). Specific resistance was less than 0.01 Ωcm over a wide temperature range of −50 to 280° C. in particular, thus demonstrating favorable temperature characteristics for specific resistance. In contrast, the specific resistance of n-type SiC single crystal obtained without adding Ga exceeded 0.01 Ωcm at temperatures of 300 K or less, and the temperature characteristics of specific resistance were not favorable.

COMPARATIVE EXAMPLE 2

SiC single crystal was obtained by carrying out crystal growth in the same manner as Example 1 with the exception of changing the amount of Ga from 0.06 atm % to 0.6 atm %. The resulting SiC single crystal was evaluated by the Hall effect measurement. The results are summarized in FIG. 1.

COMPARATIVE EXAMPLE 3

SiC single crystal was obtained by carrying out crystal growth in the same manner as Example 1 with the exception of changing the amount of Ga from 0.06 atm % to 6 atm %. The resulting SiC single crystal was evaluated by the Hall effect measurement. The results are summarized in FIG. 1.

As is shown in FIG. 1, according to the production method of the invention, SiC single crystal having n-type conduction is able to be obtained that has equivalent crystal characteristics as evaluated based on carrier concentration and lower specific resistance as compared with the case of carrying out crystal growth by adding N at 0.1 atm % but not adding Ga. In addition, since n-type SiC single crystal obtained according to the production method of the invention demonstrates favorable temperature characteristics for specific resistance, it can be preferably used in switching devices or diodes for use in vehicle-mounted inverters and the like that require low specific resistance over a wide working temperature range (such as −55° C. to 120° C.).

EXAMPLE 2

Figure 4:
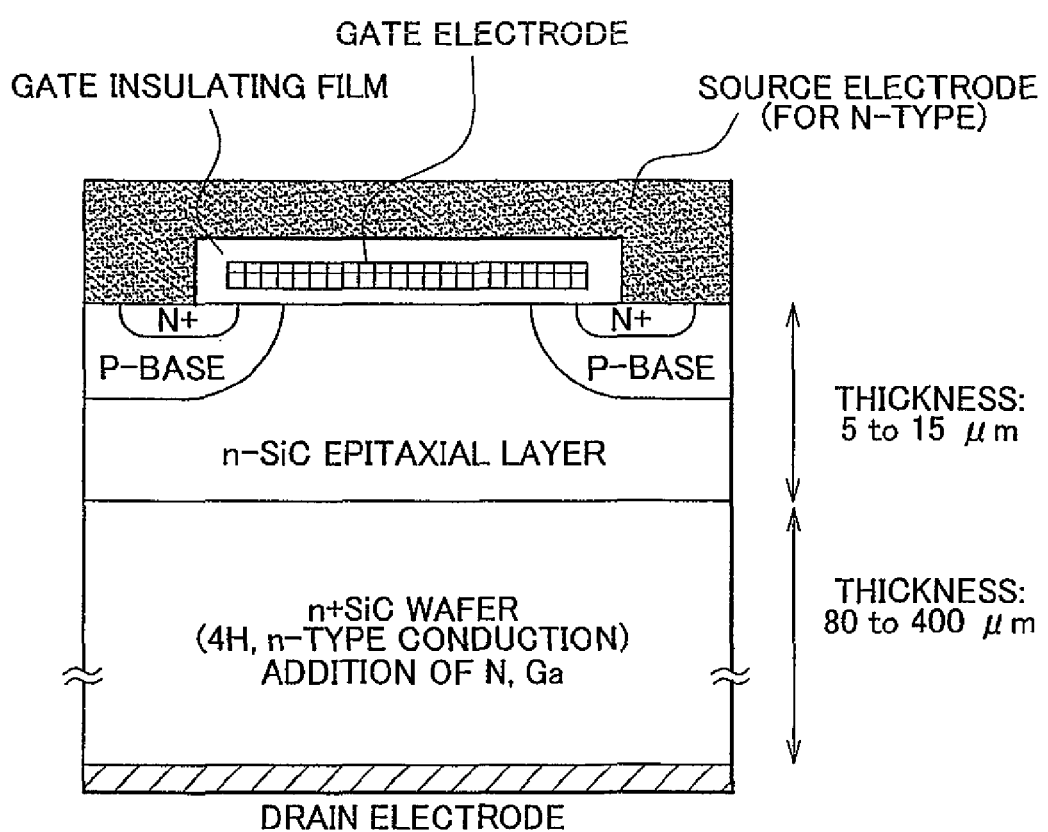
FIG. 4 is a cross-sectional schematic drawing of one application of n-type SiC single crystal obtained according to embodiments of the invention in the form of a switching device.

A cross-sectional schematic diagram of a switching device that uses n-type SiC single crystal obtained according to the invention as an n$^+$ wafer is shown in FIG. 4. Incidentally, "n$^+$" shown in FIG. 4 indicates that the wafer is of n-type conduction and has a high concentration of dopant.

EXAMPLE 3

Figure 5:
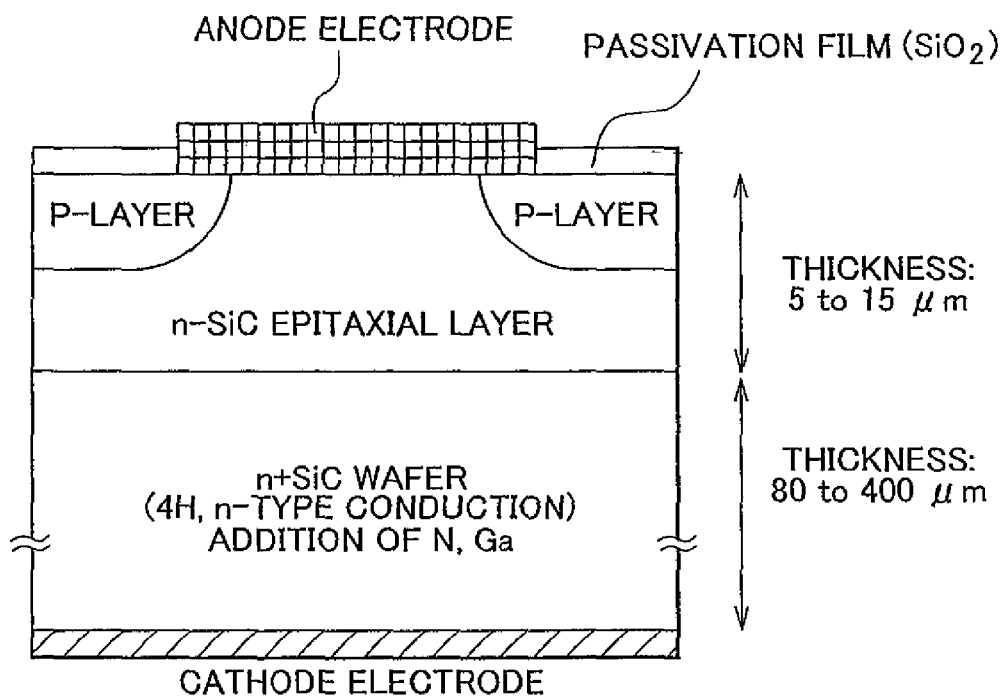
FIG. 5 is cross-sectional schematic drawing of another application of n-type SiC single crystal obtained according to embodiments of the invention in the form of a diode.

A cross-sectional schematic diagram of a Schottky barrier diode (SBD) that uses an n-type SiC single crystal obtained according to the invention as an n$^+$ wafer is shown in FIG. 5. Incidentally, "n$^+$" shown in FIG. 5 indicates that the wafer is of n-type conduction and has a high concentration of dopant.

According to the SiC single crystal production method of the invention, n-type SiC single crystal can be obtained that has low specific resistance as well as low carrier concentration that were unable to be previously realized, thereby enabling the production of n-type SiC single crystal with favorable reproducibility.

The invention claimed is:

1. A method for producing n-type SiC single crystal, comprising:
    adding gallium and nitrogen, which is a donor element for obtaining an n-type semiconductor, during crystal growth of SiC single crystal, such that a ratio of an amount of nitrogen, as represented in at. %, to an amount of SiC is greater than a ratio of an amount of gallium, as represented in at. %, to the amount of SiC,
    wherein
    the ratio of the amount of nitrogen is greater than 0 and equal to or less than 1.0 at.%,
    the ratio of the amount of gallium is greater than 0 and equal to or less than 0.06 at.%, the specific resistance of the n-type SiC single crystal is less than 0.015 Ωcm at 80 K to 580 K, the n-type SiC single crystal has a carrier concentration (n) on the order of magnitude of $10^{19}$ cm$^{-3}$, and the n-type SiC single crystal is a n-type 4H—SiC single crystal.

2. The method for producing n-type SiC single crystal according to claim 1, wherein SiC single crystal is grown by a solution method.

3. The method for producing n-type SiC single crystal according to claim 2, wherein the n-type 4H—SiC single crystal is grown at a growth temperature of 1880° C. or higher.

4. The method for producing n-type SiC single crystal according to claim 1, wherein the ratio of the amount of nitrogen is from 0.1 at.% to 1.0 at.%, and the ratio of the amount of gallium is from 0.05 at.% to 0.06 at.%.

5. The method for producing n-type SiC single crystal according to claim 1, wherein the ratio of the amount of nitrogen is 0.1 at.%, and the ratio of the amount of gallium is 0.05 at.%.

6. The method for producing n-type SiC single crystal according to claim 1, wherein the n-type SiC single crystal has a carrier concentration (n) of about $2.2\times10^{19}$ cm$^{-3}$.

7. An n-type SiC single crystal obtained according to the production method of claim 1.

8. The n-type SiC single crystal according to claim 7, wherein the specific resistance of the n-type SiC single crystal is 0.010 Ωcm or less.

9. A semiconductor device, comprising:
the n-type SiC single crystal according to claim 7.

\* \* \* \* \*